(12) United States Patent
Kang et al.

(10) Patent No.: US 10,119,542 B2
(45) Date of Patent: Nov. 6, 2018

(54) ELECTRIC COMPRESSOR

(71) Applicant: Hanon Systems, Daejeon (KR)

(72) Inventors: Eun Seok Kang, Daejeon-si (KR);
Jung Seon Kim, Daejeon-si (KR);
Sung Jun Park, Daejeon-si (KR);
Seung Hwan Shin, Daejeon-si (KR);
Young Hun Lee, Daejeon-si (KR)

(73) Assignee: HANON SYSTEMS, Daejeon (KR)

( * ) Notice: Subject to any disclaimer, the term of this patent is extended or adjusted under 35 U.S.C. 154(b) by 0 days.

(21) Appl. No.: 15/505,321

(22) PCT Filed: Jun. 19, 2015

(86) PCT No.: PCT/KR2015/006241
§ 371 (c)(1),
(2) Date: Feb. 21, 2017

(87) PCT Pub. No.: WO2016/167409
PCT Pub. Date: Oct. 20, 2016

(65) Prior Publication Data
US 2018/0023568 A1      Jan. 25, 2018

(30) Foreign Application Priority Data

Apr. 17, 2015   (KR) .................. 10-2015-0054710

(51) Int. Cl.
*H05K 7/20*     (2006.01)
*F04C 23/00*    (2006.01)
(Continued)

(52) U.S. Cl.
CPC ............ *F04C 23/008* (2013.01); *F01C 21/10* (2013.01); *F04C 18/0215* (2013.01);
(Continued)

(58) Field of Classification Search
CPC . G06F 1/181–1/182; H05K 7/20218–7/20381;
(Continued)

(56) References Cited

U.S. PATENT DOCUMENTS 7,887,307 B2 *  2/2011  Laing ..................... H02K 11/25
                                                  417/366
8,777,591 B2 *  7/2014  Cho ....................... F01C 17/066
                                                  417/366
(Continued)

FOREIGN PATENT DOCUMENTS

CN      203856580 U    10/2014
JP      H01150549 U    10/1989
(Continued)

*Primary Examiner* — Anthony Haughton
*Assistant Examiner* — Razmeen Gafur
(74) *Attorney, Agent, or Firm* — Shumaker, Loop & Kendrick, LLP; James D. Miller

(57) ABSTRACT

An electric compressor includes a cover. The cover is reinforced by forming straight ribs, ring ribs, connection ribs, or hexagonal ribs having a honeycomb structure. The straight ribs, rings ribs, connection ribs, or hexagonal ribs are formed on the inner side or the outer side of a body of the cover on a side of an inverter.

13 Claims, 8 Drawing Sheets

(51) Int. Cl.
*F01C 21/10* (2006.01)
*F04C 29/06* (2006.01)
*F04C 18/02* (2006.01)
*H01L 23/473* (2006.01)

(52) U.S. Cl.
CPC ......... *F04C 29/06* (2013.01); *H05K 7/20936*
(2013.01); *F04C 2240/808* (2013.01)

(58) Field of Classification Search
CPC ............... H05K 7/20409–7/20418; H05K
7/20009–7/202; H01L 23/367–23/3677;
H01L 23/473; H01L 23/46–23/467
USPC ...... 361/676–678, 679.46–679.54, 688–723;
165/80.1–80.5, 104.33, 185;
174/15.1–15.3, 16.1–16.3, 547, 548;
257/712–722, E23.088; 24/453, 458–459;
454/184; 312/236
See application file for complete search history.

(56) References Cited

U.S. PATENT DOCUMENTS

| | | | | |
|---|---|---|---|---|
| 2002/0062656 A1* | 5/2002 | Suitou | ................... | F01C 21/10 62/259.2 |
| 2006/0039807 A1* | 2/2006 | Hamaoka | ................ | F04B 35/04 417/415 |
| 2006/0113851 A1* | 6/2006 | Ishihara | .................. | H02K 9/20 310/52 |
| 2007/0257576 A1* | 11/2007 | Adaniya | ................ | H02K 1/276 310/156.53 |
| 2007/0273239 A1* | 11/2007 | Kobayashi | ............ | H02K 1/185 310/216.044 |
| 2009/0108697 A1* | 4/2009 | Uetsuji | ................. | H02K 1/187 310/216.011 |
| 2010/0074772 A1 | 3/2010 | Hoshino et al. | | |
| 2010/0084933 A1* | 4/2010 | Ishikawa | ................ | F01C 21/10 310/89 |
| 2010/0209266 A1* | 8/2010 | Ikeda | ..................... | F04B 35/04 417/410.1 |
| 2012/0308414 A1* | 12/2012 | Ogawa | ................... | F04B 39/06 417/410.5 |
| 2013/0142682 A1* | 6/2013 | Watanabe | ............ | F04B 39/121 417/423.7 |
| 2013/0257210 A1* | 10/2013 | Hattori | ................ | H02K 1/2766 310/156.08 |
| 2014/0001898 A1* | 1/2014 | Hattori | .................. | H02K 3/522 310/71 |
| 2014/0205478 A1* | 7/2014 | Guitari | ................... | F04B 35/04 417/410.1 |
| 2015/0207375 A1* | 7/2015 | Horiba | .................... | H02K 1/16 310/215 |
| 2015/0249373 A1* | 9/2015 | Fukasaku | ................ | H02K 3/48 310/214 |
| 2016/0160861 A1* | 6/2016 | Ichise | .................... | F04C 29/028 418/55.6 |
| 2016/0273536 A1* | 9/2016 | Deguchi | ................ | F01C 21/10 |
| 2016/0294251 A1* | 10/2016 | Fukasaku | ................ | H02K 7/04 |
| 2016/0333880 A1* | 11/2016 | Onara | ................ | F04C 29/0085 |
| 2017/0040864 A1* | 2/2017 | Takabe | .................... | F04B 35/04 |
| 2017/0117762 A1* | 4/2017 | Takahata | .................... | F04B 39/00 |
| 2017/0229943 A1* | 8/2017 | Hattori | .................... | F04B 35/04 |
| 2018/0013324 A1* | 1/2018 | Takabe | .................... | H02K 5/24 |

FOREIGN PATENT DOCUMENTS

| | | |
|---|---|---|
| JP | 2002129973 A | 5/2002 |
| JP | 2005291456 A | 10/2005 |
| JP | 2008215236 A | 9/2008 |
| JP | 2010178537 A | 8/2010 |
| JP | 2013177826 A | 9/2013 |
| JP | 2013209909 A | 10/2013 |
| KR | 1020100099860 A | 9/2010 |
| KR | 1020120136162 A | 12/2012 |

\* cited by examiner

[Fig. 1]
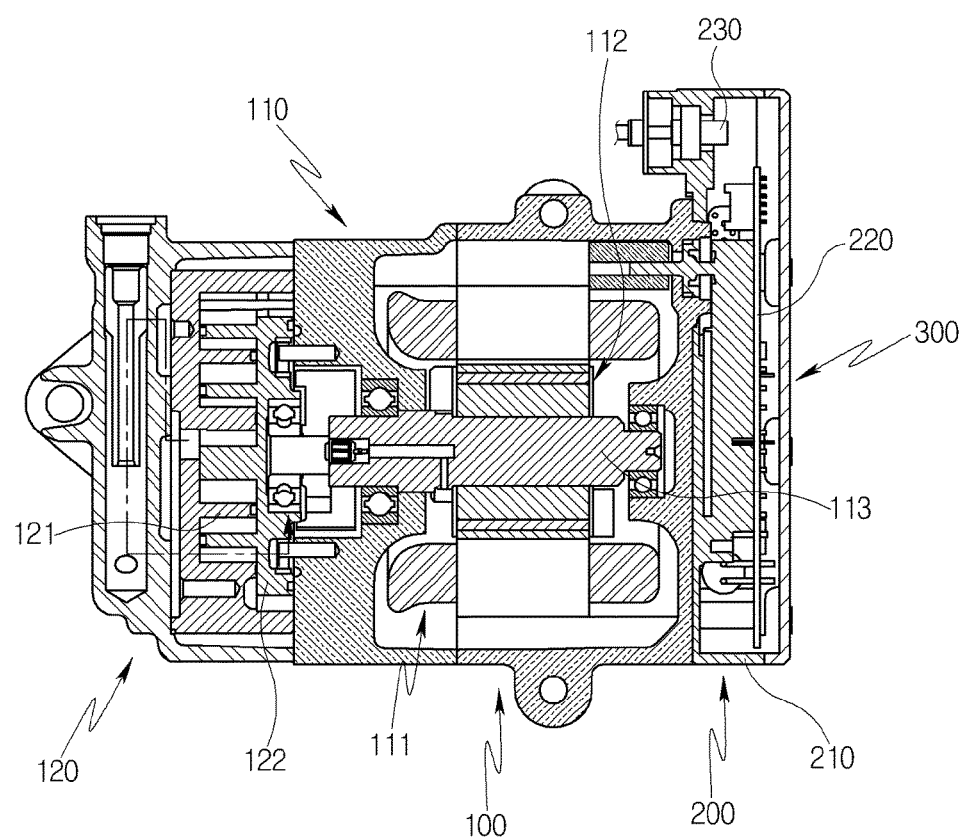

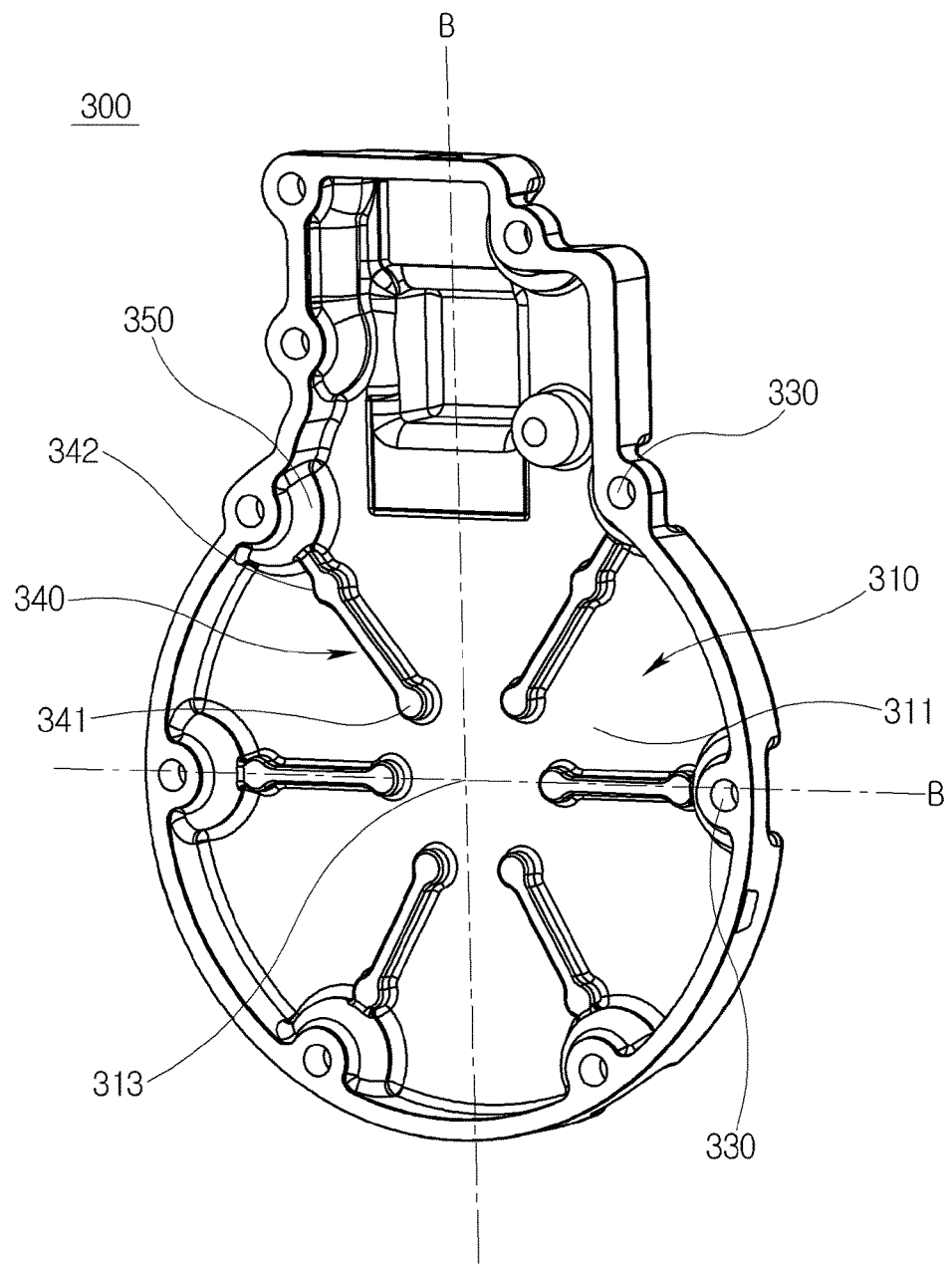
[Fig. 2]

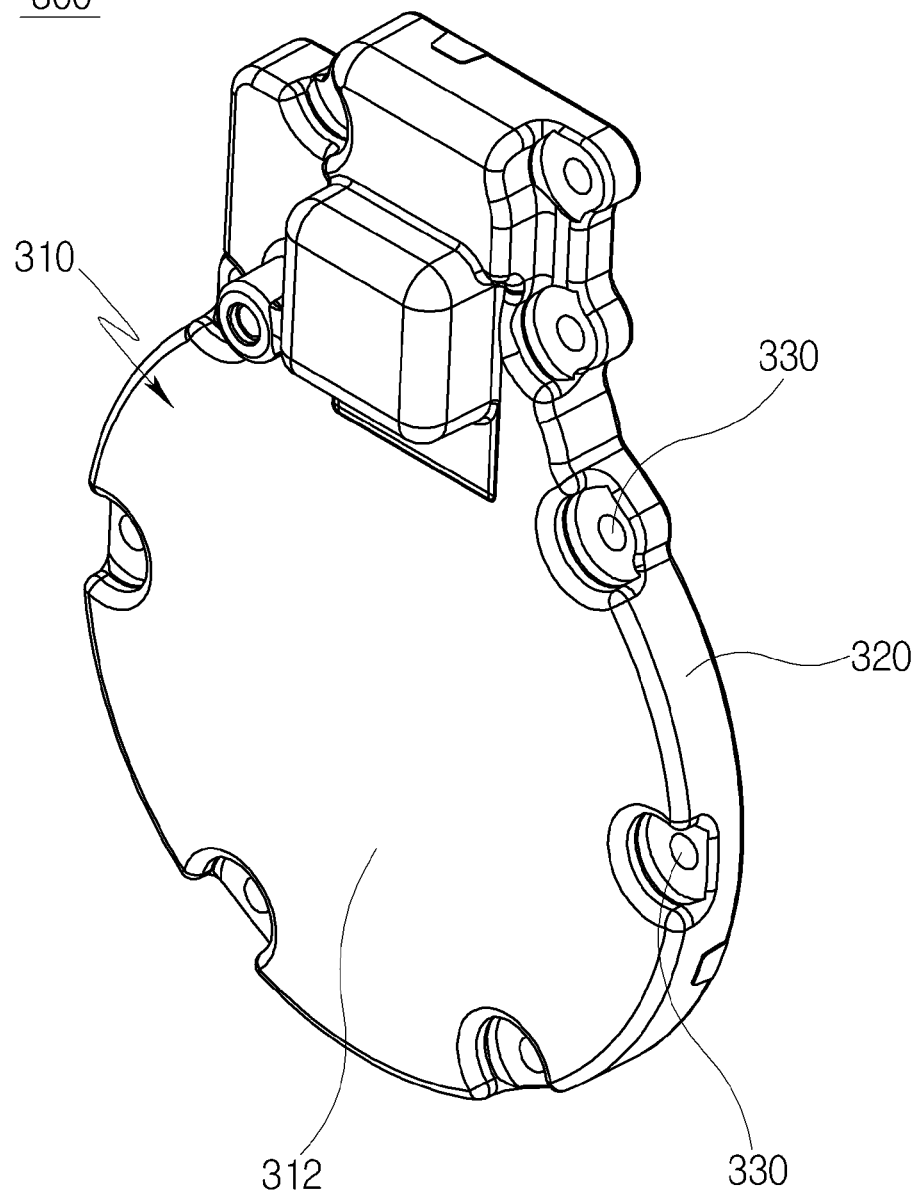
[Fig. 3]

[Fig. 4]
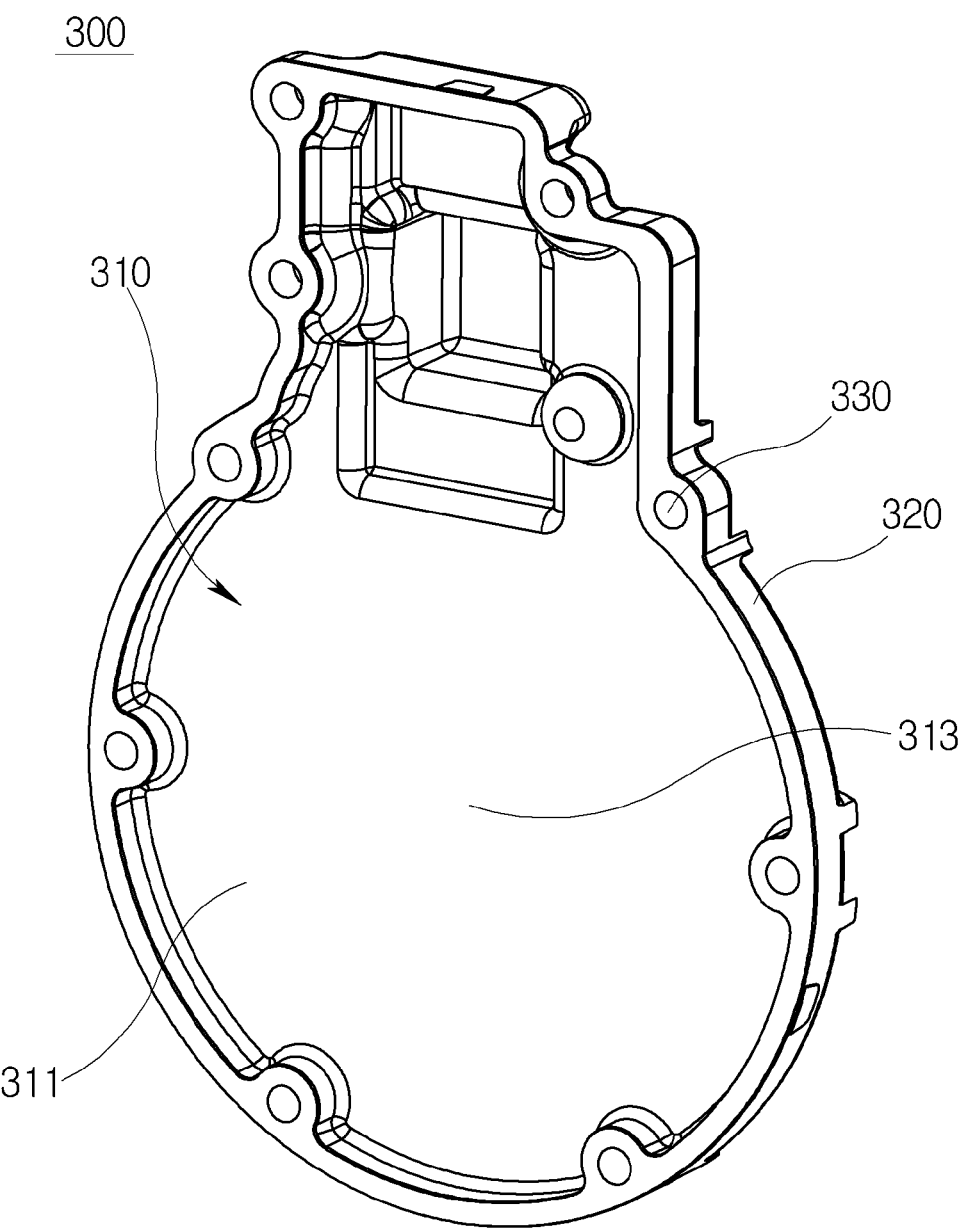

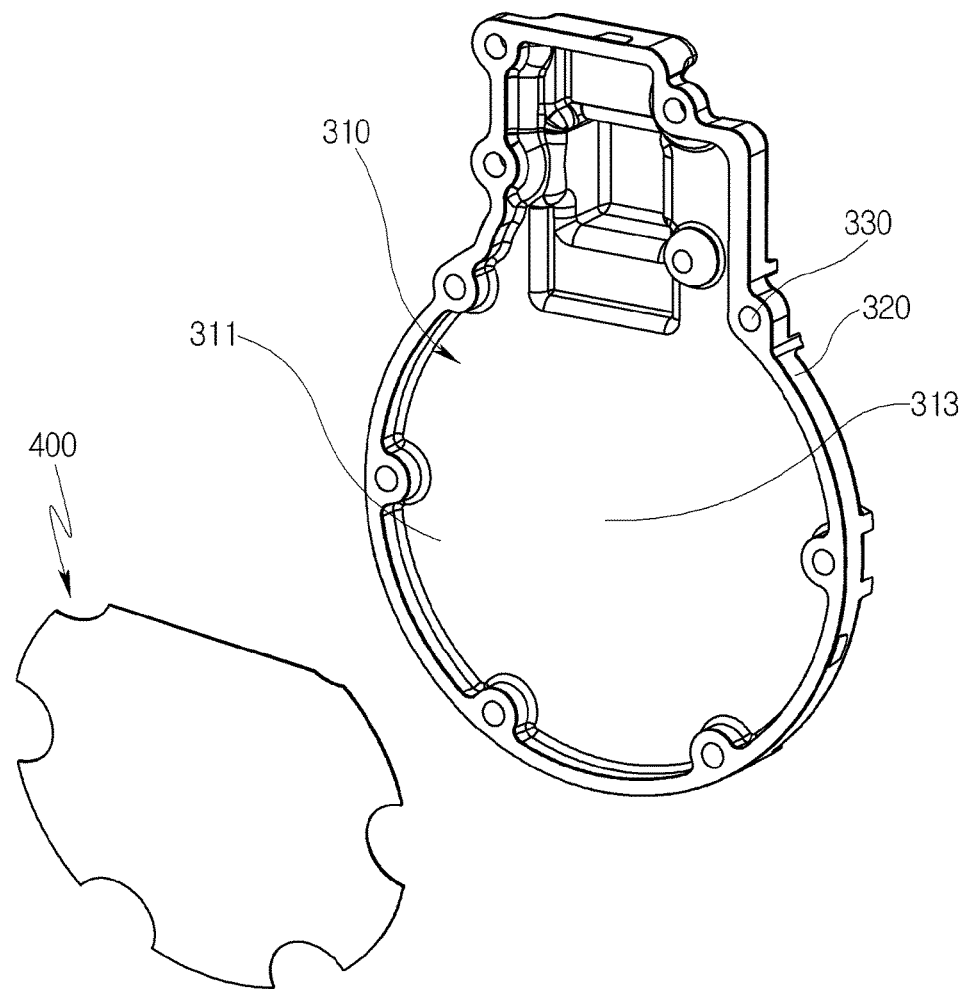
[Fig. 5]

[Fig. 6]
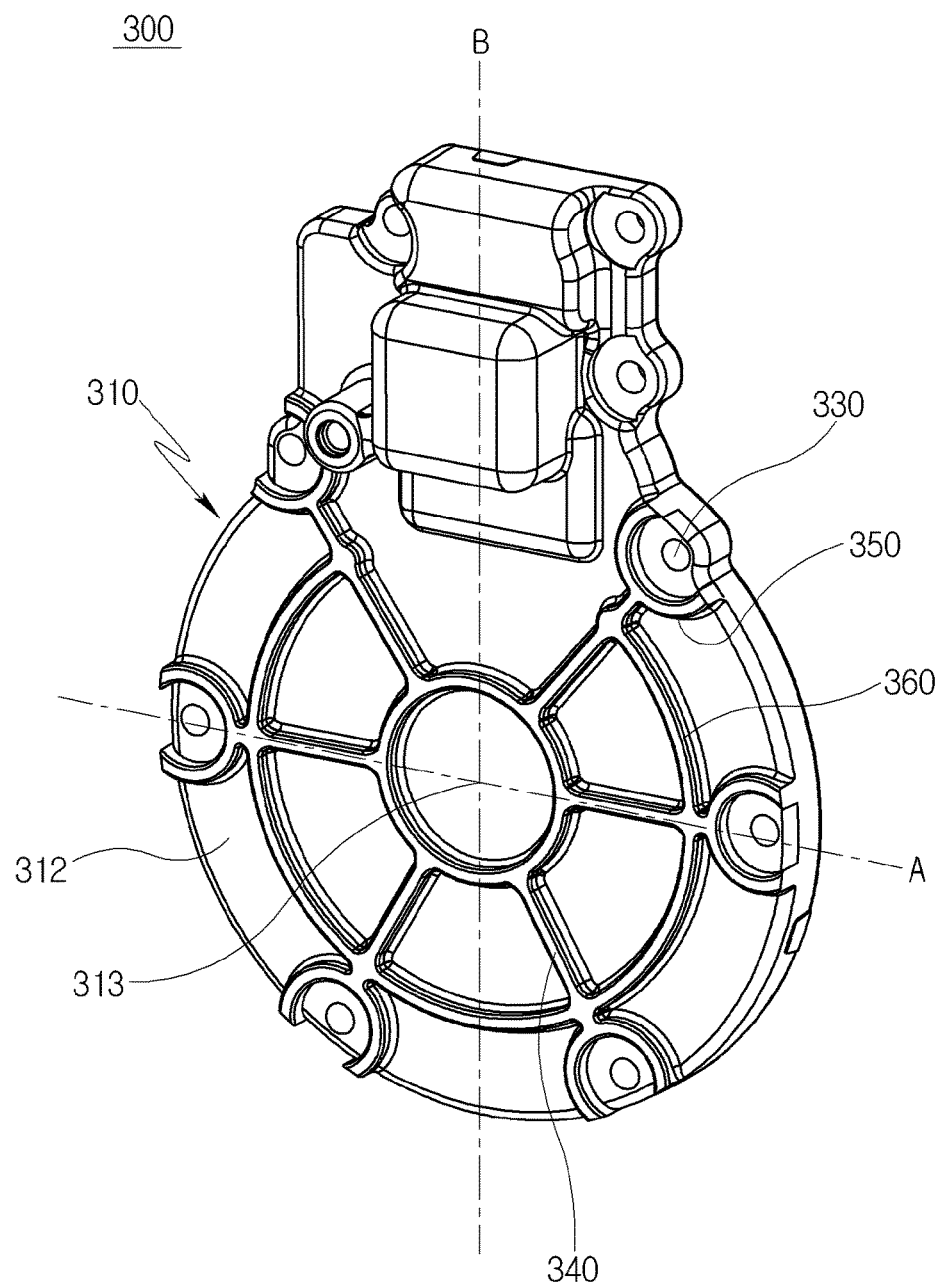

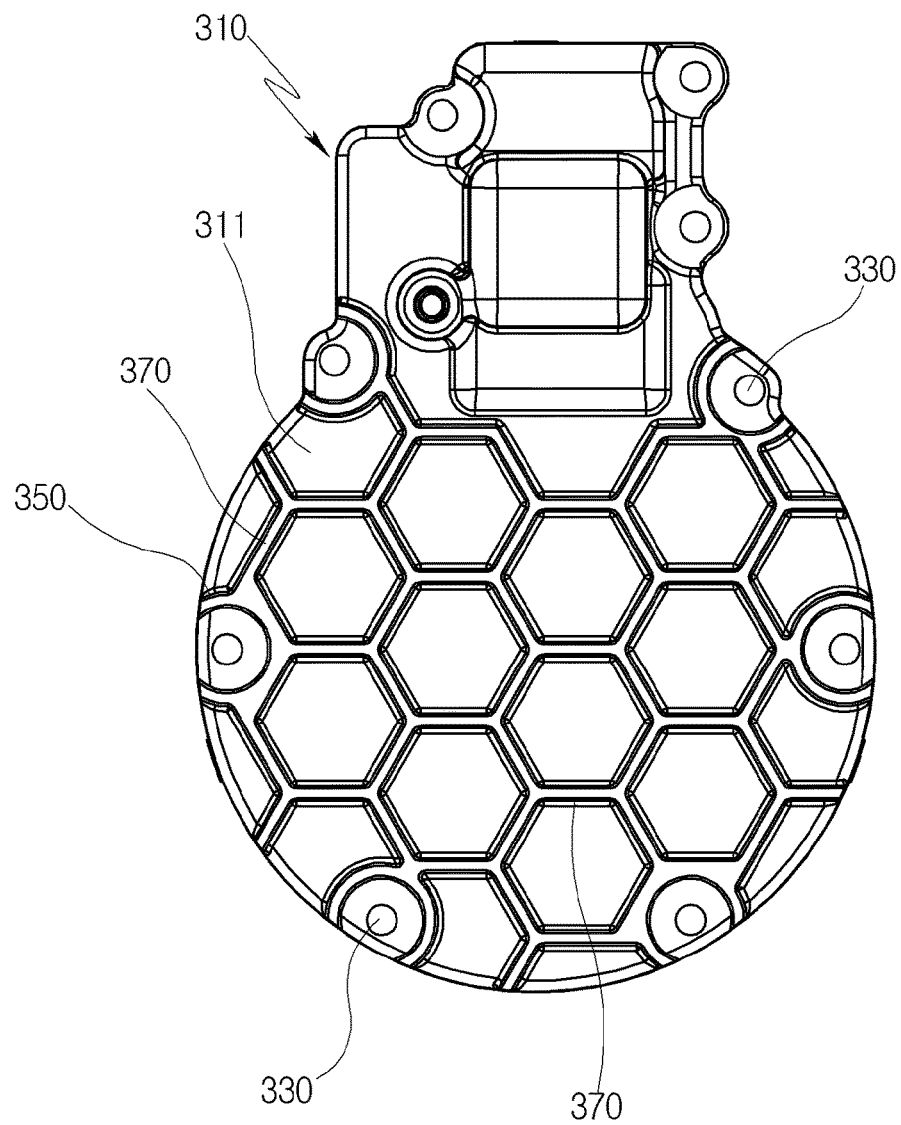
[Fig. 7]

[Fig. 8]
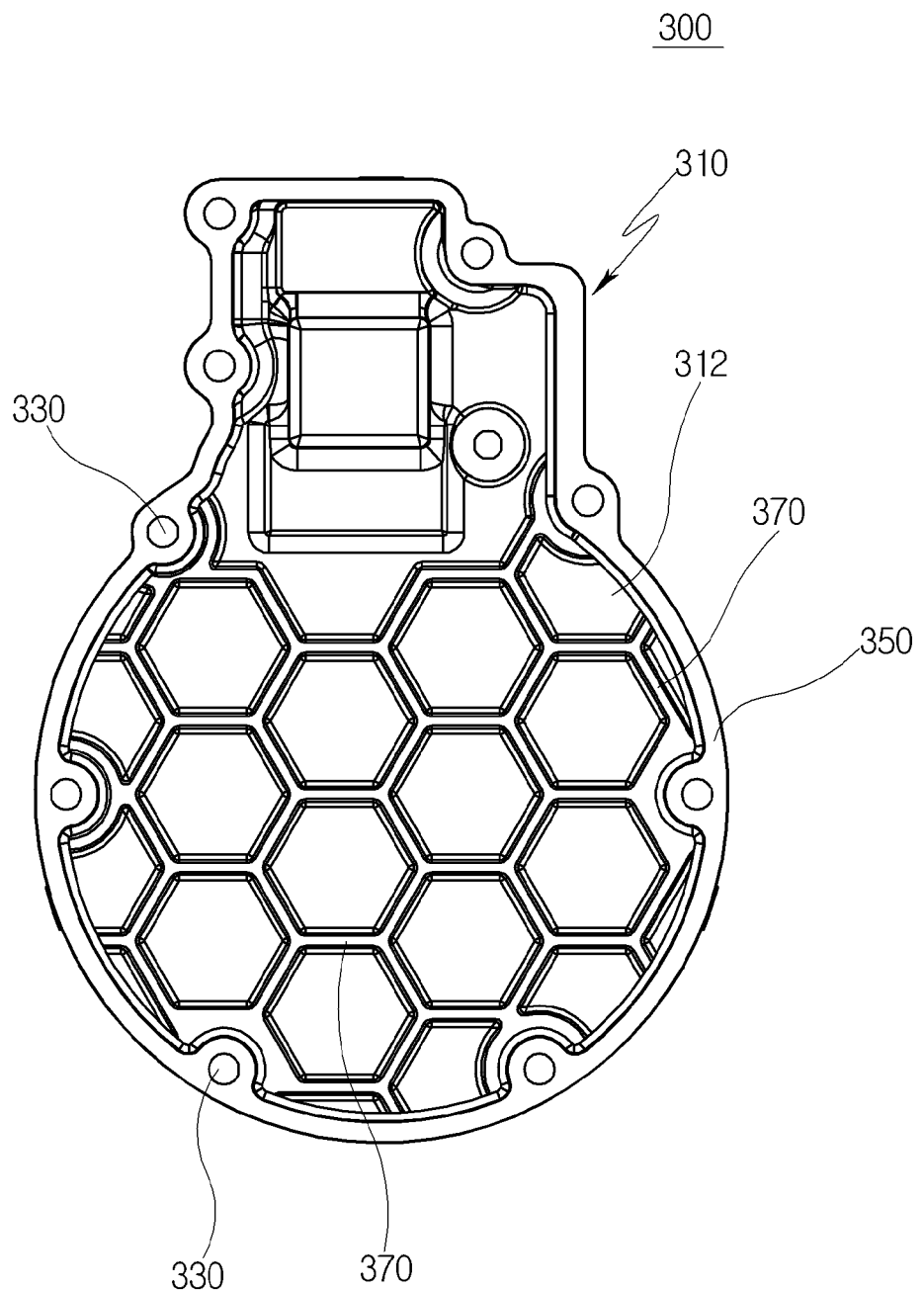

ELECTRIC COMPRESSOR

CROSS-REFERENCE TO RELATED PATENT APPLICATIONS

This patent application is a United States nation phase patent application based on PCT/KR2015/006241 filed on Jun. 19, 2015, which claims the benefit of Korean Patent Application No. 10-2015-0054710, filed on Apr. 17, 2015, the disclosures of which are hereby incorporated herein by reference in their entirety.

FIELD OF THE INVENTION

Exemplary embodiments of the present invention relate to an electric compressor, more particularly, relates to an automotive electric motor in which strength of a cover is reinforced by forming straight ribs, ring ribs, connection ribs, or hexagonal ribs having a honeycomb structure on the inner side or the outer side of the body of a cover on a side of a inverter and vibration and noise from compressor housing can be reduced in accordance with operational states of a driving unit and a compression unit.

BACKGROUND

In general, a compressor that is used in the air-conditioning system for a vehicle sucks a coolant, which has evaporated through an evaporator, changes into the coolant at high temperature and high pressure for easy liquefaction, and then sends it to a condenser.

Such a compressor is operated in a way of compressing a coolant using power from the engine of a vehicle and a way of compressing a coolant through a compression unit using torque from a driving unit such as a driving motor operated by separate power.

In general, an electric compressor that compresses a coolant using torque from a driving unit operated by separate power includes a driving unit, which includes a driving motor in a compressor housing, and a compression unit that compresses a coolant. The driving motor of the driving unit is controlled by an inverter at a side in the compressor housing, and accordingly, the RPM of the driving motor is controlled and cooling efficiency can be variably controlled.

However, the cover on a side of the inverter of electric compressors of the related art is a thin plate, so the strength is low. Further, since the cover is a thin plate and the strength is low, the cover is easily damaged or broken even by small shock, so the time and cost for maintaining the electric compressors are increased.

Further, according to the electric compressors of the related art, when they are operated, vibration and noise are generated by rotation of the driving unit and operation of the compression unit, and the vibration and noise generated in the compressor housing are transmitted to the cover, so they decrease fatigue strength of the cover, and if severe, they damage the cover.

Further, according to the electric compressors of the related art, when they are operated, resonance sound in a specific frequency band is generated by the vibration and noise transmitted from the compression housing, so the vibration and noise are amplified and interfere with riding comfort for a driver or passengers.

SUMMARY OF THE INVENTION

An object of the present invention relates to an electric compressor in which strength of a cover can be reinforced by forming straight ribs, ring ribs, connection ribs, or hexagonal ribs having a honeycomb structure on the inner side or the outer side of the body of a cover on a side of an inverter, vibration and noise from compressor housing can be reduced in accordance with operational states of a driving unit and a compression unit, and resonance sound on the cover or damage to the cover can be prevented.

In accordance with one aspect of the present invention, an electric compressor includes: a compressor housing 100 including a driving unit 110 and a compression unit 120 for compressing a coolant; an inverter 200 disposed at a side of the compressor housing 100; and a cover 300 disposed at a side of the inverter 200, in which the cover 300 includes: a body 310; a side wall 320 extending inward from the body and formed along the edge of the body 310; a plurality of fastening holes 330 formed through the body 310 to fasten the cover 300 to the compressor housing 100; and a plurality of straight ribs 340 formed on the inner side 311 or an outer side 312 of the body 310 and extending toward a center 313 of the inner side 311 or the outer side 312 of the body 310 from the fastening holes 330.

The cover 300 may further include a plurality of ring ribs 350 formed on the inner side 311 or the outer side 312 of the body 310 and connected to a portion of the straight ribs 340 close to the fastening holes 330 to surround the fastening holes 330.

The cover 300 may further include connection ribs 360 connected to a portion of the straight ribs 340 and formed in a circular shape around the center 313 of the inner side 311 or the outer side 312 of the body 310.

The connection ribs 360 may be coaxially formed with predetermined intervals around the center 313 of the inner side 311 or the outer side 312 of the body 310.

The straight ribs 340 each may further include a first flange 341 extending at both sides of the free end of the straight ribs 340.

The straight ribs 340 each may further include a second flange 342 extending at both sides of a portion of the straight ribs 340.

The straight ribs 340, the ring ribs 350, and the connection ribs 360 may protrude inward on the inner side 311 of the body 310 or protrude outward on the outer side 312 of the body 310.

The electric compressor may further include an insulating member 400 disposed on the inner side 311 of the body 310.

The straight ribs 340, the ring ribs 350, and the connection ribs 360 may be formed symmetrically to each other with respect to a horizontal center line A of the body 310 on the inner side 311 or the outer side 312 of the body 310.

The straight ribs 340, the ring ribs 350, and the connection ribs 360 may be formed symmetrically to each other with respect to a vertical center line B of the body 310 on the inner side 311 or the outer side 312 of the body 310.

In accordance with another aspect of the present invention, an electric compressor include: a compressor housing 100 including a driving unit 110 and a compression unit 120 for compressing a coolant; an inverter 200 disposed at a side of the compressor housing 100; and a cover 300 disposed at a side of the inverter 200, in which the cover 300 includes: a body 310; a side wall 320 extending inward from the body and formed along the edge of the body 310; a plurality of fastening holes 330 formed through the body 310 to fasten the cover 300 to the compressor housing 100; and a plurality of hexagonal ribs 370 formed on the inner side 311 or the outer side 312 of the body 310.

The cover 300 may further include a plurality of ring ribs 350 formed on the inner side 311 or the outer side 312 of the body 310 and connected to a portion of the hexagonal ribs 370 close to the fastening holes 330 to surround the fastening holes 330.

The hexagonal ribs 370 and the ring ribs 350 may protrude inward on the inner side 311 of the body 310 or protrude outward on the outer side 312 of the body 310.

The electric compressor may further include an insulating member 400 disposed on the inner side 311 of the body 310.

According to the electric compressor of the present invention, since straight ribs, ring ribs, or connection ribs are formed or hexagonal ribs having a honeycomb structure are formed on the inner side or the outer side of the body of the cover disposed at a side of the inverter, it is possible to reinforce and increase strength of the cover.

Further, according to the electric compressor of the present invention, since the strength of the cover of the electric compressor is reinforced, it is possible to minimize damage or break of the cover, so it is possible to reduce the costs and time for maintaining the electric compressor.

Further, according to the electric compressor of the present invention, since straight ribs, ring ribs, or connection ribs are formed or hexagonal ribs having a honeycomb structure are formed on the inner side or the outer side of the body of the cover, it is possible to prevent resonance sound and improve riding comfort for a driver or passengers.

Further, according to the electric compressor of the present invention, when the straight ribs, ring ribs, or connection ribs are formed or hexagonal ribs having a honeycomb structure are formed on the outer side of the body of the cover, an insulating distance from the circuit board of the inverter is reduced by the insulating member disposed on the inner side of the body of the cover, so it is possible to reduce the size of the electric compressor.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a cross-sectional view showing an electric compressor according to an embodiment of the present invention;

FIG. 2 is a perspective view of an electric compressor cover according to an embodiment of the present invention, seen from the inside;

FIG. 3 is a perspective view of an electric compressor cover according to an embodiment of the present invention, seen from the outside;

FIG. 4 is a perspective view of an electric compressor cover according to another embodiment of the present invention, seen from the inside;

FIG. 5 is an exploded perspective view showing an insulating member on an inner side of the electric compressor cover shown in FIG. 4;

FIG. 6 is a perspective view of an electric compressor cover according to another embodiment of the present invention, seen from the outside;

FIG. 7 is a front view of an electric compressor cover according to another embodiment of the present invention, seen from the inside; and FIG. 8 is a front view of an electric compressor cover according to another embodiment of the present invention, seen from the outside.

DETAILED DESCRIPTION OF EXEMPLARY EMBODIMENTS OF THE INVENTION

Hereinafter, embodiments of the present invention will be described in detail with reference to the accompanying drawings. The same components are given the same reference numerals in the drawings.

FIG. 1 is a cross-sectional view showing an electric compressor according to an embodiment of the present invention, FIG. 2 is a perspective view of an electric compressor cover according to an embodiment of the present invention, seen from the inside, and FIG. 3 is a perspective view of an electric compressor cover according to an embodiment of the present invention, seen from the outside. FIG. 4 is a perspective view of an electric compressor cover according to another embodiment of the present invention, seen from the inside, FIG. 5 is an exploded perspective view showing an insulating member on an inner side of the electric compressor cover shown in FIG. 4, and FIG. 6 is a perspective view of an electric compressor cover according to another embodiment of the present invention, seen from the outside. FIG. 7 is a front view of an electric compressor cover according to another embodiment of the present invention, seen from the inside and FIG. 8 is a front view of an electric compressor cover according to another embodiment of the present invention, seen from the outside.

Terminologies to be used hereafter are defined as follows. The term "inside" means the portion adjacent to a compressor housing 100 in the longitudinal direction of a rotary shaft 113 of the compressor housing 100. The term "outside" means the portion not adjacent to the compressor housing 100 in the longitudinal direction of the rotary shaft 113 of the compressor housing 100, that is, the portion opposite to the "inside" toward the rotary shaft 113 of the compressor housing 100 in the same member or the same component. The term "side" means a portion in a direction in parallel with the ground and perpendicular to the rotary shaft 113 of the compressor housing 100, that is, a side of a cover side wall 320. The term "upper portion" means a portion positioned vertically upward from both of the ground and the rotary shaft 113 of the compressor housing 100. It means a direction around the compressor housing 100 in a direction perpendicular to the rotary shaft.

An electric compressor 1 according to the present invention is described with reference to FIGS. 1 to 6. The electric compressor 1 according to an embodiment of the present invention includes a compressor housing 100, an inverter 200, and a cover 300.

The compressor housing 100 forms the external shape of the electric compressor 1. Though not necessarily limited thereto, the compressor housing 100 is formed in a hollow cylindrical shape. A driving unit 110 generating torque is disposed at a side in the compressor housing 100 and a compression unit 120 compressing a coolant using the torque from the driving unit 110 is disposed at another side in the compressor housing 100.

The driving unit 110, which generates torque, includes a stator 111 and a rotor 112. A rotary shaft 113 is connected to the rotor 112. The stator 111 is a kind of electromagnet and forcibly fitted in the compressor housing 100. Though not necessarily limited thereto, the stator 111 may be composed of a stator core and a bunch of coils wound on the stator core. The rotor 112 is disposed inside and coaxially with the stator 111. The rotary shaft 113 can be rotated with the stator 111.

The compression unit 120, which is a part for compressing a coolant using the torque from the driving unit 110, includes a fixed scroll 121 and a rotary scroll 122. The fixed scroll 121 is fixed in the compressor housing 100. The rotary scroll 122 is fitted on a portion of the rotary shaft 113 and gradually compresses a coolant compression space defined between the fixed scroll 121 and the rotary scroll 122 by rotating with the rotor 112. That is, a coolant in the compression space is compressed by relative rotation of the fixed scroll 121 and the rotary scroll 122.

Though not shown in the figures, an intake port and an exit port are disposed at portions of the compressor housing 100. The coolant flows into the compressor housing through the intake port. The coolant compressed by the compression unit 120 is discharged out of the compression housing 100 through the exit port.

Although the driving unit 110 including the stator 111 and the rotor and the scroll type compression unit 120 are exemplified in FIG. 1, the present invention is not limited thereto, and other types of driving unit and compression unit may be disposed in the compression housing 100 to compress a coolant.

The inverter 200 is disposed at a side of the compressor housing 100. Although the inverter 200 is disposed at the right side of the compressor housing 100 in FIG. 1, the present invention is not limited thereto and, the inverter 200 may be disposed at the left side of the compressor housing 100, depending on the arrangement of the driving unit 110 and the compression unit 120 in the compressor housing 100. That is, the inverter 200 is disposed at a side of the compressor housing 100 adjacent to the driving unit 110 disposed in the compressor housing 100 and controls operation of the driving unit 110.

As show in FIG. 1, the inverter 200 according to an embodiment of the present invention is composed of a body 210 and a circuit board 220.

The body 210 of the inverter 200 is formed substantially in a cylindrical shape with both ends bored and forms the external shape of the inverter 200.

The circuit board 220 of the inverter 200 is inserted in the body 210.

Electronic devices such as a transistor, a capacitor, an inductor, a fixed resistor, a diode, and a driver are mounted on the circuit board 220 and control the driving unit 110.

The cover 300 is disposed at a side of the inverter 200. That is, the cover 300 is disposed on the outer side of the inverter 200 to seal the compressor housing 100 and protect the circuit board 220 from external shock etc.

As shown in FIGS. 2 to 6, the cover 300 includes a body 310, the side wall 320, a plurality of fastening holes 330, and a plurality of straight ribs 340.

The body 310, a part forming the external shape of the cover 300, is formed substantially in a plate shape, corresponding to the body 210 of the inverter 200.

The side wall 320 extends inside the body 310 and is formed along the edge of the body 310.

The fastening holes 330 for fastening the cover 300 to the compressor housing 100 with the inverter 200 are formed through the body 310. Six fastening holes 330 are formed in FIGS. 2 to 8, but the present invention is not limited thereto. That is, various numbers of fastening holes 330 may be formed through the body 310, if necessary, depending on the size and the hermetic degree of the compressor housing 100. Though not shown in the figures, coupling holes for receiving bolts inserted through the fastening holes 330 are formed at the portion where the inverter 200 is coupled in the compressor housing 100 and a portion of the body 210 of the inverter 200, at positions corresponding to the fastening holes 330. That is, the same number of coupling holes as the fastening holes 330 is formed at the portion where the inverter 200 is coupled in the compressor housing 100 and a portion of the body 210 of the inverter 200 to correspond to the fastening holes 330.

Accordingly, the inverter 200 and the cover 300 are easily fastened to the compressor housing 100, so the manufacturing time and cost for the electric compressor 1 can be reduced and the electric compressor 1 can be easily maintained.

As shown in FIGS. 2 and 3, the plurality of straight ribs 340 extend toward the center 313 of the inner side 311 of the body 310 from the fastening holes 330 and are formed on the inner side 311 of the body 310.

Further, as shown in FIGS. 4 and 6, the plurality of straight ribs 340 extend toward the center 313 of the outer side 312 of the body 310 from the fastening holes 330 and are formed on the inner side 312 of the body 310.

Though not shown in the figures, the plurality of straight ribs 340 may be formed on both of the inner side 311 and the outer side 312 of the body 310, extending toward the centers 313 of the inner side 311 and the outer side 312 of the body 310 from the fastening holes 330.

As described above, as the straight ribs 340 are formed on the inner side 311 or the outer side 312, or on both of the inner side 311 and the outer side 312 of the body 310 of the cover 300, extending toward the centers 313 of the outer side 312 of the body 310 from the fastening holes 330, strength of the cover 300 is increased and vibration and noise transmitted from the compressor housing 100 when the driving unit 110 and the compression unit 120 in the compressor housing 100 are operated are dispersed, so vibration and noise can be reduced.

As shown in FIG. 2, the cover 300 of the electric compressor 1 according to the present invention may further include a plurality of ring ribs 350.

The ring ribs 350 are formed on the inner side 311 or the outer side 312 of the body 310 and connected to the straight ribs 340 close to the fastening holes 330 to surround the fastening holes 330. That is, if the straight ribs 340 are formed on the inner side 311 of the body 310, the ring ribs 350 are also formed on the inner side 311 of the body 310, but if the straight ribs 340 are formed on the outer side 312 of the body 310, the ring ribs 350 are also formed on the outer side 312 of the body 310. As described above, if the straight ribs 340 are formed on both of the inner side 311 and the outer side 312 of the body 310, the ring ribs 350 are also formed on both of the inner side 311 and the outer side 312 of the body 310. Vibration and noise generated when the compressor housing 100 is operated are transmitted to the cover 300 through the bolts inserted in the fastening holes 330 to fasten the cover 300 to the compressor housing 100, but the ring ribs 350 primarily disperse and reduce the vibration and noise. Further, the strength of the cover 300 is increased by the ring ribs 350.

As shown in FIG. 2, the straight ribs 340 of the cover 300 of the electric compressor 1 according to the present invention each have a first flange 341.

The first flanges 341 extend at both sides of the free ends of the straight ribs 340. Since the first flanges 341 extend at both sides of the free ends of the straight ribs 340, the strength of the cover 300 can be reinforced, as compared with when only the straight ribs 340 are formed on the inner side 311 or the outer side 312 of the body 310.

As shown in FIG. 2, the straight ribs 340 of the cover 300 of the electric compressor 1 according to the present invention each have a second flange 342. The second flanges 342 extend at both sides of portions of the straight ribs 340. That is, the second flanges 342 are formed at portions of the straight ribs 340 extending toward the center 313 of the body 310 from the fastening holes 330. As shown in FIG. 2, the first flanges 341 and the second flanges 342 may be both formed at the straight ribs 340. Since the second flanges 342 extend at both sides of portions of the straight ribs 340, the strength of the cover 300 can be reinforced, as compared with when only the straight ribs 340 are formed on the inner side 311 or the outer side 312 of the body 310.

As shown in FIGS. 4 and 6, the cover 300 of the electric compressor 1 according to the present invention may further include a plurality of connection ribs 360.

The connection ribs 360 are connected to the straight ribs 340 and make a closed circle around the center 313 of the inner side 311 or the outer side 312 of the body 310.

Further, as shown in FIG. 6, the connection ribs 360 are coaxially formed with predetermined intervals around the center 313 of the inner side 311 or the outer side 312 of the body 310.

Since the connection ribs 360 are formed, as described above, the strength of the cover 300 is increased and vibration and noise transmitted from the compressor housing 100 when the driving unit 110 and the compression unit 120 in the compressor housing 100 are operated are dispersed, so the vibration and noise can be reduced.

Although the connection ribs 360 are formed only on the outer side 312 of the body 310 of the cover 300 in FIGS. 4 and 6, the present invention is not limited thereto, and as described above, the connection ribs 360 may be formed on the inner side 311 of the body 310 of the cover 300, if necessary. Further, the connection ribs 360 may be formed on both of the inner side 311 and the outer side 312 of the body 310.

The straight ribs 340, the ring ribs 350, and the connection ribs 360 protrude inward on the inner side 311 of the body 310 or protrude outward on the outer side 312 of the body 310. That is, when the straight ribs 340, the ring ribs 350, and the connection ribs 360 are formed on the inner side 311 of the body 310, they protrude inward on the inner side 311 of the body 310. In contrast, when the straight ribs 340, ring ribs 350, and connection ribs 360 are formed on the outer side 312 of the body 310, they protrude outward on the outer side 312 of the body 310. Obviously, as described above, when the straight ribs 340, the ring ribs 350, and the connection ribs 360 are formed on both of the inner side 311 and the outer side 312 of the body 310, they protrude inward and outward on the inner side 311 and the outer side 312 of the body 310, respectively.

As shown in FIGS. 2 and 6, the straight ribs 340, the ring ribs 350, and the connection ribs 360 are formed symmetrically to each other with respect to a horizontal center line A of the body 310 on the inner side 311 or the outer side 312 of the body 310.

Further, as shown in FIGS. 2 and 6, the straight ribs 340, the ring ribs 350, and the connection ribs 360 are formed symmetrically to each other with respect to a vertical center line B of the body 310 on the inner side 311 or the outer side 312 of the body 310.

Preferably, the straight ribs 340, the ring ribs 350, and the connection ribs 360 are formed symmetrically to each other with respect to the horizontal center line A and the vertical center line B of the body 310 on the inner side 311 or the outer side 312 of the body 310.

As described above, since the straight ribs 340, the ring ribs 350, and the connection ribs 360 are formed symmetrically to each other with respect to the horizontal center line A or/and the vertical center line B of the body 310 on the inner side 311 or the outer side 312 of the body 310, vibration and noise transmitted from the compressor housing 100 to the body 310 of the cover 300 are uniformly dispersed, so resonance can be prevented and concentration of the vibration and noise on only a portion of the cover 300 can be prevented.

As shown in FIG. 5, the electric compressor 1 according to an embodiment of the present invention further includes an insulating member 400. When the straight ribs 340 and the ring ribs 350, or the connection ribs 360 are formed only on the outer side 312 of the body 310, the insulating member 400 is disposed on the inner side 311 of the body 310. In general, a predetermined insulating distance is required between the circuit board 220 of the inverter 200 and the cover 300 to prevent malfunction of the electronic devices on the circuit board 220. Accordingly, the side wall 320 of the cover 300 extends inward to provide a predetermined insulating distance. When the straight ribs 340 and the ring ribs 350, or the connection ribs 360 are formed only on the outer side 312 of the body 310, a predetermined insulating distance can be ensured by disposing the insulating member 400 on the inner side of the body 310. Accordingly, as the insulating member 400 is disposed, the thickness of the side wall 320 can be reduced and the size of the electric compressor 1 can also be reduced.

As shown in FIGS. 7 and 8, the electric compressor 1 according to another embodiment of the present invention includes a the compressor housing 100, the inverter 200, and a the cover 300.

The six fastening holes 330 are formed in FIGS. 7 and 8, but the present invention is not limited thereto. That is, various numbers of the fastening holes 330 may be formed through the body 310, if necessary, depending on the size and the hermetic degree of the compressor housing 100.

The compressor housing 100, the inverter 200, the body 310 of the cover 300, the side wall 320, and the fastening holes 330 of the electric compressor 1 according to this embodiment are the same as those described in the previous embodiment, so the differences in the shape of ribs are described hereafter.

The cover 300 of the electric compressor 1 according to this embodiment of the present invention includes a plurality of hexagonal ribs 370.

The plurality of hexagonal ribs 370 are formed on the inner side 311 (see FIG. 7) or the outer side 312 (see FIG. 8) of the body 310. The hexagonal ribs 370 have honeycomb structures.

Though not shown in the figures, the hexagonal ribs 370 having the honeycomb structure may be formed on both of the inner side 311 and the outer side 312 of the body 310, if necessary.

As described above, as the hexagonal ribs 370 having a honeycomb structure are formed on the inner side 311 or the outer side 312, or on both of the inner side 311 and the outer side 312 of the body 310 of the cover 300, strength of the cover 300 is increased and vibration and noise transmitted from the compressor housing 100 when the driving unit 110 and the compression unit 120 in the compressor housing 100 are operated are dispersed, so vibration and noise can be reduced.

As shown in FIGS. 7 and 8, the cover 300 of the electric compressor 1 according to the present invention may further include the plurality of ring ribs 350.

The ring ribs 350 are formed on the inner side 311 or the outer side 312 of the body 310 and connected to the hexagonal ribs 370 close to the fastening holes 330 to surround the fastening holes 330. That is, if the hexagonal ribs 370 are formed on the inner side 311 of the body 310, the ring ribs 350 are also formed on the inner side 311 of the body 310, but if the hexagonal ribs 370 are formed on the outer side 312 of the body 310, the ring ribs 350 are also formed on the outer side 312 of the body 310. As described above, if the hexagonal ribs 370 are formed on both of the inner side 311 and the outer side 312 of the body 310, the ring ribs 350 are also formed on both of the inner side 311 and the outer side 312 of the body 310. Vibration and noise generated when the compressor housing 100 is operated are transmitted to the cover 300 through the bolts inserted in the fastening holes 330 to fasten the cover 300 to the compressor housing 100, but the ring ribs 350 primarily disperse and reduce the vibration and noise. Further, the strength of the cover 300 is further increased by the ring ribs 350.

The hexagonal ribs 370 and the ring ribs 350 protrude inward on the inner side 311 of the body 310 or outward on the outer side 312 of the body 310. That is, when the hexagonal ribs 370 and the ring ribs 350 are formed on the inner side 311 of the body 310, the hexagonal ribs 370 protrude inward on the inner side 311 of the body 310. Further, as shown in FIG. 8, when the hexagonal ribs 370 and ring ribs 350 are formed on the outer side 312 of the body 310, the hexagonal ribs 370 protrude outward on the outer side 312 of the body 310. Obviously, as described above, when the hexagonal ribs 370 and ring ribs 350 are formed on both of inner side 311 and the outer side 312 of the body 310, they protrude inward and outward on the inner side 311 and the outer side 312 of the body 310, respectively.

As shown in FIG. 5, the electric compressor 1 according to another embodiment of the present invention further includes the insulating member 400. When the hexagonal ribs 370 and the ring ribs 350 are formed only on the outer side 312 of the body 310, the insulating member 400 is disposed on the inner side 311 of the body 310. In general, a predetermined insulating distance is required between the circuit board 220 of the inverter 200 and the cover 300 to prevent malfunction of the electronic devices on the circuit board 220. Accordingly, the side wall 320 of the cover 300 extends inward to provide a predetermined insulating distance. When the hexagonal ribs 370 and the ring ribs 350 are formed only on the outer side 312 of the body 310, a predetermined insulating distance can be ensured by disposing the insulating member 400 on the inner side 311 of the body 310. Accordingly, as the insulating member 400 is disposed, the thickness of the side wall 320 can be reduced and the size of the electric compressor 1 can also be reduced.

Table 1 shows magnitude (db) of noise inside, outside, over, and on a side of the cover when an electric compressor is operated at 3000 rpm in accordance with arrangement of ribs on the inner side 311 of the body 310 of the cover 300.

TABLE 1

| | Rib arrangement | Inside | Outside | On side | Over |
|---|---|---|---|---|---|
| Comparative example | No rib | 60.9 | 67.0 | 65.0 | 64.8 |
| Experimental example 1 | Only straight ribs with first and second flanges and ring ribs | 57.9 | 64.2 | 63.2 | 62.1 |
| Experimental example 2 | Straight ribs with first and second flanges, ring ribs, and connection ribs | 57.8 | 64.7 | 63.4 | 62.0 |
| Experimental example 3 | Hexagonal ribs and ring ribs | 57.7 | 66.1 | 63.9 | 61.3 |

Table 2 shows magnitude (db) of noise inside, outside, over, and on a side of the cover when an electric compressor is operated at 3000 rpm in accordance with arrangement of ribs on the outer side 312 of the body 310 of the cover 300.

TABLE 2

| | Rib arrangement | Inside | Outside | On side | Over |
|---|---|---|---|---|---|
| Comparative example | No rib | 60.9 | 67.0 | 65.0 | 64.8 |
| Experimental example 4 | Only straight ribs with first and second flanges and ring ribs | 60.6 | 66.2 | 64.6 | 64.4 |
| Experimental example 5 | Straight ribs with first and second flanges, ring ribs, and connection ribs | 60.1 | 65.6 | 64.4 | 64.2 |
| Experimental example 6 | Hexagonal ribs and ring ribs | 60.7 | 66.1 | 64.8 | 64.3 |

As shown in Table 1 and Table 2, it can be seen that noise is reduced when ribs are formed on the inner side 311 or the outer side 312 of the body 310 of the cover 300 (experimental examples 1 to 6), as compared with when there is not a rib (comparative example).

Further, most preferably, it can be seen that the largest effect in improving the strength of the cover 300 and reducing vibration and noise was obtained when ribs are formed on the inner side 311 of the body 310 of the cover 300, as in Experimental example 2, and when ribs are formed on the outer side 312 of the body 310 of the cover 300, as in Experimental example 5.

As described above, since various shapes of ribs are formed on the inner side 311 or the outer side 312 of the body 310, it is possible to reinforce the strength of the cover 300, reduce vibration and noise transmitted from the compressor housing 100, and prevent resonance sound.

The present invention is not limited to the modifications shown in the figures and the embodiments described above, and may be achieved in other embodiments within claims.

What is claimed is:
1. An electric compressor comprising:
   a compressor housing including a driving unit and a compression unit for compressing a coolant;
   an inverter disposed at a side of the compressor housing; and
   a cover disposed at a side of the inverter, wherein the cover includes:
   a body;
   a side wall extending inwardly from the body and formed along an edge of the body;
   a plurality of fastening holes formed through the body to fasten the cover to the compressor housing;
   a plurality of straight ribs formed on an inner side or an outer side of the body and extending toward a center of the inner side or the outer side of the body from the fastening holes; and
   a plurality of ring ribs formed on the inner side or the outer side of the body and connected to a portion of the straight ribs close to the fastening holes to surround the fastening holes.

2. The electric compressor of claim 1, wherein the cover further includes connection ribs connected to a portion of the straight ribs and formed in a circular shape around the center of the inner side or the outer side of the body.

3. The electric compressor of claim 2, wherein the connection ribs are coaxially formed with predetermined intervals around the center of the inner side or the outer side of the body.

4. The electric compressor of claim 1, wherein the cover further includes connection ribs formed on the inner side or the outer side of the body, and wherein the straight ribs, the ring ribs, and the connection ribs protrude inwardly on the inner side of the body or protrude outwardly on the outer side of the body.

5. An electric compressor comprising:
a compressor housing including a driving unit and a compression unit for compressing a coolant;
an inverter disposed at a side of the compressor housing; and
a cover disposed at a side of the inverter, wherein the cover includes:
a body;
a side wall extending inwardly from the body and formed along an edge of the body;
a plurality of fastening holes formed through the body to fasten the cover to the compressor housing; and
a plurality of straight ribs formed on an inner side or an outer side of the body and extending toward a center of the inner side or the outer side of the body from the fastening holes, wherein the straight ribs each further includes a first flange extending at both sides of a free end of each of the straight ribs.

6. The electric compressor of claim 5, wherein the straight ribs each further includes a second flange extending at both sides of a portion of each of the straight ribs.

7. The electric compressor of claim 6, wherein the cover further includes connection ribs formed on the inner side or the outer side of the body, and wherein the straight ribs, a plurality of ring ribs, and the connection ribs protrude inwardly on the inner side of the body or protrude outwardly on the outer side of the body.

8. The electric compressor of claim 7, further comprising an insulating member disposed on the inner side of the body.

9. The electric compressor of claim 8, wherein the straight ribs, the ring ribs, and the connection ribs are formed symmetrically to each other with respect to a horizontal center line of the body on the inner side or the outer side of the body.

10. The electric compressor of claim 9, wherein the straight ribs, the ring ribs, and the connection ribs are formed symmetrically to each other with respect to a vertical center line of the body on the inner side or the outer side of the body.

11. An electric compressor comprising:
a compressor housing including a driving unit and a compression unit for compressing a coolant;
an inverter disposed at a side of the compressor housing; and
a cover disposed at a side of the inverter, wherein the cover includes: a body;
a side wall extending inwardly from the body and formed along an edge of the body;
a plurality of fastening holes formed through the body to fasten the cover to the compressor housing;
a plurality of hexagonal ribs formed on an inner side or an outer side of the body; and
a plurality of ring ribs formed on the inner side or the outer side of the body and connected to a portion of the hexagonal ribs close to the fastening holes to surround the fastening holes.

12. The electric compressor of claim 11, wherein the hexagonal ribs and the ring ribs protrude inwardly on the inner side of the body or protrude outwardly on the outer side of the body.

13. The electric compressor of claim 12, further comprising an insulating member disposed on the inner side of the body.

* * * * *